(12) United States Patent
Sieberer et al.

(10) Patent No.: US 12,346,771 B2
(45) Date of Patent: Jul. 1, 2025

(54) DEVICE FOR CONTROLLING TRAPPED IONS AND INCLUDING A DELTA/SIGMA DAC MODULE

(71) Applicant: Infineon Technologies Austria AG, Villach (AT)

(72) Inventors: Michael Sieberer, Graz (AT); Gerhard Maderbacher, Gleisdorf (AT); Clemens Roessler, Villach (AT); Christoph Sandner, Villach (AT); Herwig Wappis, Drobollach (AT)

(73) Assignee: Infineon Technologies Austria AG, Villach (AT)

( * ) Notice: Subject to any disclaimer, the term of this patent is extended or adjusted under 35 U.S.C. 154(b) by 700 days.

(21) Appl. No.: 17/671,669

(22) Filed: Feb. 15, 2022

(65) Prior Publication Data

US 2022/0261681 A1    Aug. 18, 2022

(30) Foreign Application Priority Data

Feb. 15, 2021    (EP) ..................................... 21157117

(51) Int. Cl.
*G06N 10/40* (2022.01)
*G21K 1/00* (2006.01)
*H01J 49/42* (2006.01)

(52) U.S. Cl.
CPC ............. *G06N 10/40* (2022.01); *G21K 1/006* (2013.01); *H01J 49/426* (2013.01)

(58) Field of Classification Search
CPC ....... G06N 10/40; G21K 1/006; H01J 49/426; H03M 3/50
See application file for complete search history.

(56) References Cited

U.S. PATENT DOCUMENTS

| | | | | |
|---|---|---|---|---|
| 6,075,392 A | * | 6/2000 | Sandner | H03K 5/1252 327/145 |
| 8,716,674 B2 | | 5/2014 | Sherwood | |
| 8,754,361 B1 | * | 6/2014 | Rafferty | H01J 49/424 250/252.1 |
| 12,126,363 B2 | * | 10/2024 | Das | H03M 3/324 |
| 2004/0031918 A1 | * | 2/2004 | Schoen | H01J 49/022 250/282 |
| 2006/0163472 A1 | * | 7/2006 | Marquette | H01J 49/4295 250/290 |
| 2021/0026162 A1 | * | 1/2021 | Apisdorf | G06F 1/0321 |

(Continued)

OTHER PUBLICATIONS

Brandl, Matthias F., "A Quantum von Neumann Architecture for Large-Scale Quantum Computing", arXiv:1702.02583 [quant-ph]; https://doi.org/10.48550/arXiv.1702.02583, Nov. 15, 2017, pp. 1-44.

(Continued)

*Primary Examiner* — David A Vanore
(74) *Attorney, Agent, or Firm* — Murphy, Bilak & Homiller, PLLC (57) ABSTRACT

A device for controlling trapped ions includes an ion trap, a plurality of field electrodes configured to control ions in the ion trap, and a controller chip. The controller chip includes at least one delta-sigma digital to analog converter (DS-DAC) module including a DS-DAC circuit configured to receive a digital data stream, convert the digital data stream to analog control voltages, and supply the analog control voltages to the field electrodes.

19 Claims, 4 Drawing Sheets

(56) References Cited

U.S. PATENT DOCUMENTS

| | | | |
|---|---|---|---|
| 2022/0261681 A1* | 8/2022 | Sieberer | G21K 1/006 |
| 2024/0006092 A1* | 1/2024 | Repp | G21K 1/00 |
| 2024/0039554 A1* | 2/2024 | Das | H03M 3/50 |
| 2024/0105355 A1* | 3/2024 | Brandl | H03M 1/74 |

OTHER PUBLICATIONS

Brandl, Matthias F., "Towards Cryogenic Scalable Quantum Computing with Trapped Ions", Dissertation; https://www.quantumoptics.at/images/publications/dissertation/brandl_diss_web.pdf, Nov. 29, 2016, pp. 1-138.

Bruzewicz, Colin D., et al., "Trapped-Ion Quantum Computing: Progress and Challenges", Applied Physics Reviews 6, 021314 (2019); https://doi.org/10.1063/1.5088164, Apr. 9, 2019, pp. 1-56.

Das, Kushal, et al., "Effect of deep cryogenic temperature on silicon-on-insulator CMOS mismatch: A circuit designer's perspective", Cryogenics 62; www.elsevier.com/locate/cryogenics, 2014, pp. 84-93.

De Clercq, Ludwig E., "Transport Quantum Logic Gates for Trapped Ions", https://doi.org/10.3929/ethz-a-010584586, 2015, pp. 1-173.

Rahman, M. T., et al., "A cryogenic DAC operating down to 4.2 K", Cryogenics 75; www.elsevier.com/locate/cryogenics, 2016, pp. 47-55.

Stuart, J., et al., "Chip-Integrated Voltage Sources for Control of Trapped Ions", American Physical Society; Physical Review Applied 11, Feb. 5, 2019, pp. 024010-1 to 024010-7.

\* cited by examiner

DEVICE FOR CONTROLLING TRAPPED IONS AND INCLUDING A DELTA/SIGMA DAC MODULE

TECHNICAL FIELD

The present disclosure is related in general to the field of quantum computing with trapped ions. More specifically, the present disclosure is related to a device for controlling trapped ions and to a method of controlling trapped ions in a device.

BACKGROUND

Trapped ions are one of the most promising candidates for use as qubits (quantum bits) in quantum computers. Presently, the most advanced ion traps can control about 50 qubits individually and can maintain up to 16 qubits in a fully entangled state. Future quantum computers will need to increase the number of controllable qubits to more than 100 or even 1000 to outperform classical supercomputers. Further, the number of ions used for each qubit will in future be raised to about 6 to 100 ions in order to allow for more efficient error-correction during quantum computing.

Trapped-ion quantum computing is possible at room temperature, but operation at cryogenic temperatures improves the achievable vacuum and reduces anomalous motional heating. The higher vacuum reduces the collision rate with the background gas and is thus essential for scaling quantum computers beyond 50 ions. Current experiments use cryostats to cool the ion trap, which then operates at about T=10 K. These experimental ion traps usually use discrete electronics placed at room temperature to generate the auxiliary voltages that control the position of the ion in the trap by changing the voltage on the trap's field plates or electrodes and thus the electric potential that surrounds the ions.

For these and other reasons there is a need for the present disclosure.

SUMMARY

A first aspect of the present disclosure is related to a device for controlling trapped ions, the device comprising an ion trap, a plurality of field electrodes configured to control the ions in the ion trap, and a controller chip electrically connected to the field electrodes, the controller chip comprising at least one delta-sigma digital to analog converter (DS-DAC) module comprising a DS-DAC circuit configured to receive a digital data stream, to convert the digital data stream to analog control voltages, and to supply the analog control voltages to the field electrodes.

A second aspect of the present disclosure is related to a method of controlling trapped ions in a device, the device comprising a carrier, an ion trap disposed on the carrier, a plurality of field electrodes configured to control the ions in the ion trap, and a controller chip disposed on the carrier, the controller chip comprising at least one delta-sigma digital to analog converter (DS-DAC) module comprising a DS-DAC circuit the method being carried out at temperatures below 20 K and comprising supplying a digital data stream to an input of the DS-DAC circuit, converting the digital data stream into a stream of analog control voltages in the DS-DAC circuit, and supplying the analog control voltages to the field electrodes.

A third aspect of the present disclosure is related to a device for controlling trapped ions, the device comprising a carrier, an ion trap disposed on the carrier, a plurality of field electrodes configured to control the ions in the ion trap, and a controller chip disposed on the carrier and electrically connected to the field electrodes, the controller chip comprising at least one digital to analog converter (DAC) module comprising a DAC circuit configured to receive a digital data stream, to convert the digital data stream to analog control voltages, and to supply the analog control voltages to the field electrodes.

The present disclosure in particular helps to overcome the following problems with the state of the art.

In a cryogenic environment, matching between MOS devices generally deteriorates. For example, threshold voltage mismatch may increase by a significant amount. This decrease in device matching leads to nonlinearities in digital-to-analog converters (DACs). While the monotonicity (or differential nonlinearity DNL) of the digital-to-analog conversion can be maintained (e.g. by thermometer codes), integral nonlinearity (INL) is especially problematic for arbitrary waveform generation where nonlinearities generate harmonic tones that affect the quality of the generated signal.

A further aspect is out-of-band (quantization) noise. Trapped ions are particularly susceptible to electric field noise in the MHz-regime, because this noise changes the motional state of the ion and leads to motional heating which can then destroy its quantum state. Thus conventional ion traps currently use strong discrete analog filters to attenuate noise in this problematic frequency range.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1:
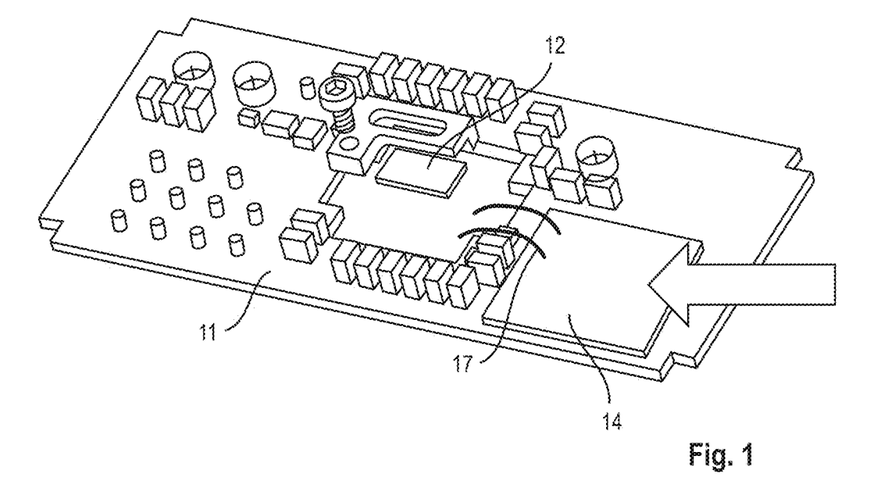
FIG. 1 shows a schematic perspective top view onto an example of a device for controlling trapped ions in which device the controller chip is connected to the field electrodes by bond wires.

FIG. 1 shows an example of a device for controlling trapped ions.

More specifically, FIG. 1 shows a carrier 11, an ion trap 12 disposed on the carrier 11, a plurality of field electrodes 13 for controlling the ions on the surface of the ion trap 12, and a controller chip 14 disposed on the carrier 11, wherein the controller chip 14 is configured to receive a digital data stream and to convert the digital data stream to analog control voltages, i.e. continuous analog waveforms and to supply these waveforms as control voltages to the field electrodes 13.

The carrier can be implemented in the form of, for example, a PCB, a substrate (like the ones used to carry ICs in a desktop CPU), a common silicon, sapphire or glass wafer that forms the basis for both the ion trap and the controller chip. It should be mentioned, however, that use of a carrier is not mandatory and if a carrier is used it does not have to be a common substrate for both the ion trap and the controller chip, but instead should only allow to dispose them in a side-by-side arrangement.

According to an example the ion trap is spaced less than 10 cm, in particular 5 cm, apart from the controller chip.

The digital data may be fed to the DAC chip by an LVDS interface (indicated by the thick arrow), wherein LVDS is a technical standard that specifies electrical characteristics of a differential, serial signaling standard. LVDS operates at low power and can run at very high speeds normally using inexpensive twisted-pair copper cables.

The controller chip 14 comprises at least one delta-sigma digital to analog converter (DS-DAC) module 140 comprising a DS-DAC circuit configured to receive the digital data stream, to convert the digital data stream to a stream of analog control voltages, and to supply the analog control voltages to the field electrodes 13.

The controller chip 14 may comprise one or more of such DS-DAC modules. In case of two or more DS-DAC modules, each one can be configured to receive a digital data stream, to convert the digital data stream to analog control voltages, and to supply the control voltages to only one of the field electrodes or to a subset of the field electrodes.

Figure 2:
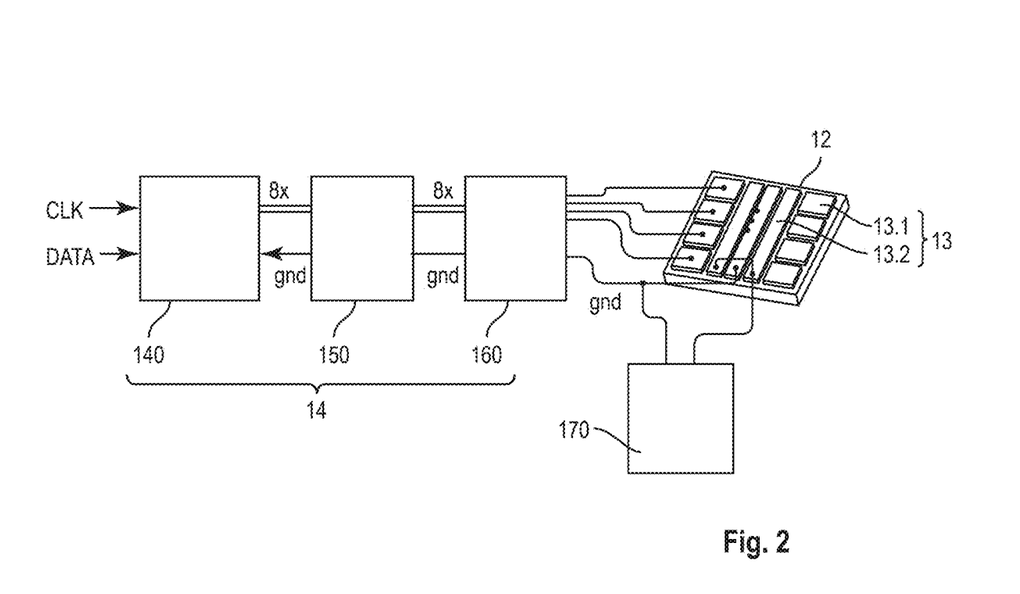
FIG. 2 shows an example of an electronic circuit of a device for controlling trapped ions which electronic circuit comprises a low pass filter and an analogue multiplexer for delivering the electrical signals to the field electrodes.

FIG. 2 shows an example of an electronic circuit of a device for controlling trapped ions.

As can be seen in FIG. 2, the controller chip 14 comprises one delta-sigma digital to analog converter (DS-DAC) module 140 which is configured to receive the LVDS signal (DATA) and to receive the digital data stream, to convert the digital data stream to a stream of analog control voltages, and to supply the analog control voltages to all field electrodes 13. For this purpose the controller chip 14 may further comprise an analog multiplexer 160 comprising an input connected to an output of the single DS-DAC module 140 and a plurality of outputs connected to the plurality of field electrodes 13.

The analog multiplexer 160 may comprise a switching matrix comprising a number of matrix elements which number corresponds to the number of DC electrodes 13.2.

The controller chip 14 may further comprise a number of low pass filters 150 which number also corresponds to the number of DC electrodes 13.2. The low pass filters 150 are connected between the DS-DAC module 140 and the analog multiplexer 160.

According to another example the controller chip 14 may comprise a DS-DAC module for each one of the field electrodes 13 so that the number of DS-DAC modules corresponds to the number of field electrodes 13 in which case no analog multiplexer would be required.

According to another example the controller chip 14 may comprise two or more DS-DAC modules but less DS-DAC modules than field electrodes 13. In this case one DS-DAC module could supply the control voltages to a subset of the field electrodes by use of an analog multiplexer as was described in connection with FIG. 2. In this case the number of DS-DAC module provided on the controller chip would correspond to the number of analog multiplexers and the number of subsets of field electrodes 13. An example thereof will be shown and explained below in connection with FIG. 3.

According to an example as shown in FIG. 1 the controller chip 14 is connected to the field electrodes 13 by means of bond wires 17. It should be mentioned, however, that the electrical connections can also be implemented differently, for example, by metallic clips or by metallization layers which may be formed in an encapsulant covering the controller chip 14 and the ion trap 12.

FIG. 2 also shows schematically the ion trap on the right end of the circuit representation. The ion trap 12 in the present disclosure may be constructed like an RF Paul trap or a Penning trap.

As can further be seen in FIG. 2, that the two rows of field electrodes each contain four DC electrodes 13.2 so that a total number of eight DC electrodes 13.2 is provided in the ion trap 12. Accordingly the control chip 14 comprises eight low pass filters 150 and an analog multiplexer 160 comprising a switching matrix with eight matrix elements. It should be mentioned that the representation of the ion trap 12 in FIG. 2 is largely simplified. More specifically, the number of DC electrodes is shown to be eight in FIG. 2 but may be much higher in a practical realization.

Figure 3:
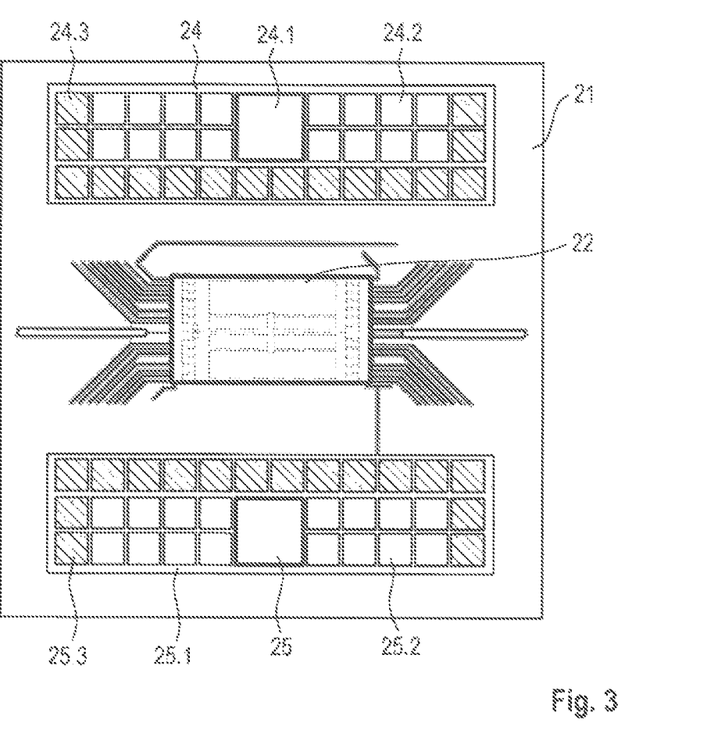
FIG. 3 shows a schematic top view on an example of a physical layout of a carrier.

FIG. 3 shows a schematic top view on an example of physical layout of a carrier of a device for controlling trapped ions.

More specifically, FIG. 3 shows a carrier 21 and an ion trap 22 disposed on the carrier 21. Similar to the example shown in FIG. 2, the ion trap 22 comprises a plurality of field electrodes (not shown) for controlling the ions in the ion trap 22. As a difference to FIG. 2, the ion trap 22 comprises an RF electrode arrangement and 16 DC electrodes on either side of the RF electrode arrangement, therefore a total number of 32 electrodes. It should be mentioned again that the representation of the ion trap 22 in FIG. 3 is largely simplified and the number of DC electrodes may be much higher in a practical realization. As a further difference to FIG. 2, there are provided two control chips 24 and 25 arranged symmetrically on opposing sides of the ion trap 22. The control chips 24 and 25 are essentially of identical design wherein a first control chip 24 comprises a first DS-DAC module 24.1, and a second control chip 25 comprises a second DS-DAC module 25.1. Furthermore the first control chip 24 comprises 16 low pass filters 24.2 connected in series after the first DS-DAC module 24.1, and similarly the second control chip 25 comprises 16 low pass filters 25.2 connected in series after the second DS-DAC module 25.1. Furthermore the first control chip 24 comprises an analog multiplexer comprising a switching matrix of 16 matrix elements 24.3 connected in series after the 16 low pass filters 24.2, and similarly the second control chip 25 comprises an analog multiplexer comprising a switching matrix of 16 matrix elements 25.3 connected in series after the 16 low pass filters 25.2. Finally on both sides the matrix elements can be connected via bond wires (not shown) with contact pads provided on the ion trap 12, and the contact pads are connected with the field electrodes of the ion trap 22.

The low pass filters 24.2 and 25.2 can be implemented in the form of discrete L/C or R/C filters or in the form of any kinds or active low pass filters.

Figure 4:
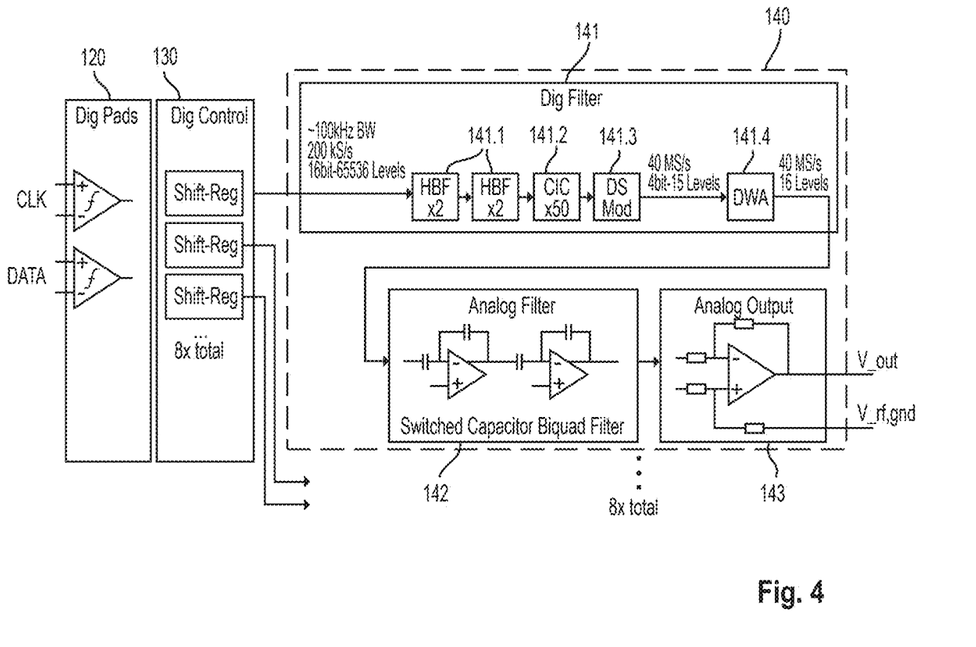
FIG. 4 shows an example of an electronic circuit comprising the Delta Sigma DAC module.

FIG. 4 shows an example of an electronic circuit comprising the Delta Sigma DAC module.

More specifically, the electronic circuit of FIG. 4 comprises a contact pad section 120, a control and shift register section 130, and the DS-DAC module 140.

The contact pad section 120 comprises a first contact pad 121 for supplying a clock signal and a second contact pad 122 for supplying the data like the digital LVDS data shown in FIG. 1. A serial data bus feeds the data using a single electrical signal. For LVDS, pairs of contact pads can be used for clock and data, respectively.

The digital control circuitry of the DAC unit 130 may contain a set of shift registers to split the incoming data stream onto several channels. In the example as depicted in FIG. 4 8 different DS-DAC modules 140 may be provided for generating electrical signals for eight field electrodes of the ion trap. Hence the control and shift register section 130 comprises 8 shift registers 130.1 to 130.8 configured to split up the incoming data stream onto the DAC channels and to deliver the electrical signals to the 8 DS-DAC modules 140. In the present case an incoming data packet comprises (8×16 bit=) 128 bit which is split up by the shift registers 130.1 to 130.8 to 8 bit data packets of 16 bit each and each one of these data packets is delivered to one of the 8 DS-DAC modules 140.

Each one of the 8 DS-DAC modules 140 comprises a digital filter 141, an analog low pass filter 142, and an analog output 143.

The digital filter 141 comprises two half band filters 141.1, a cascaded integrator comb filter 141.2, a DS-DAC circuit 141.3, and a data-weighted averaging circuit 141.4, all these devices connected in series one after the other.

The data stream entering the digital filter 141 comprises 16 bit data packets at a data rate of 200 kS/s corresponding to a signal bandwidth of 100 kHz. The two half band filters 141.1 and the cascaded integrator comb filter 141.2 together form an interpolation filter which is configured to perform a 200 times oversampling. The two half band filters 141.1 each increase the data rate by a factor of 2 and the cascaded integrator comb filter 141.2 increases the data by a factor of 50, forming an oversampled digital data stream. This oversampled data stream is then noise-shaped by means of delta-sigma modulation (141.3). The delta-sigma modulator reduces the digital data stream to 4 bit width. A data-weighted averaging algorithm (141.4) mitigates noise caused by mismatch in the digital-to-analog conversion. The data stream entering the digital-to-analog converter and filter (142) comprises 4 bit data packets at a data rate of 40 MS/s. The DS modulation algorithm and interpolation filter are digital and thus unaffected by changes in semiconductor behaviour at very low temperatures. Moreover, the usual simulation methods and measurements at room temperature suffice to assess its performance.

The delta sigma modulation works by separating the digital data packets in the 4 most significant bits (MSB) and the residue, this process is called quantization. The MSB are passed onto the DWA algorithm and consequently to the digital-to-analog converter and filter. The residue is stored and added to the following data packet. If this were not done, the information stored in the residue were lost, this is called quantization error. The delta-sigma method suppresses this error.

Due to the high data rata of the oversampled digital data stream the analog filter circuit 142 operates at a much higher frequency than required by the Nyquist criterion.

The analog data stream is then supplied to an analog low pass filter 142 which can be realized by a switched capacitor biquad filter. From the external clock signal an internal switching sequence is derived and with this internal switching cycle all switches of the switched capacitor filter are periodically driven. The performance of this filter depends mostly on the relative capacitor values and the switching frequency. For the most part, it is thus unaffected by the transistor's behavioral changes in the low temperature regime. Furthermore, this filter can be designed such that the signal delay is constant for all frequencies in the passband. This may turn out to be a significant advantage for trapped ion control because it reduces distortions on the trapping potential during transient changes.

Thereafter the signal is supplied to an analog output 143 which is essentially a high voltage output amplifier configured to amplify the electrical signals output by the switched capacitor filter 142 from values around a few 100 mV to required values of ±10 V. This output voltage is referenced to an external ground that will drift independent of the voltage reference for the chip. Thus the DS-DAC 141 together with switched capacitor filter 142 will use this external ground as a reference to stabilize the output voltage.

In difference to FIG. 2, in the embodiment as shown in FIG. 4 no analog multiplexer is required as each one of the field electrodes is supplied with electrical signals by an own DS-DAC module 140.

Figure 5:
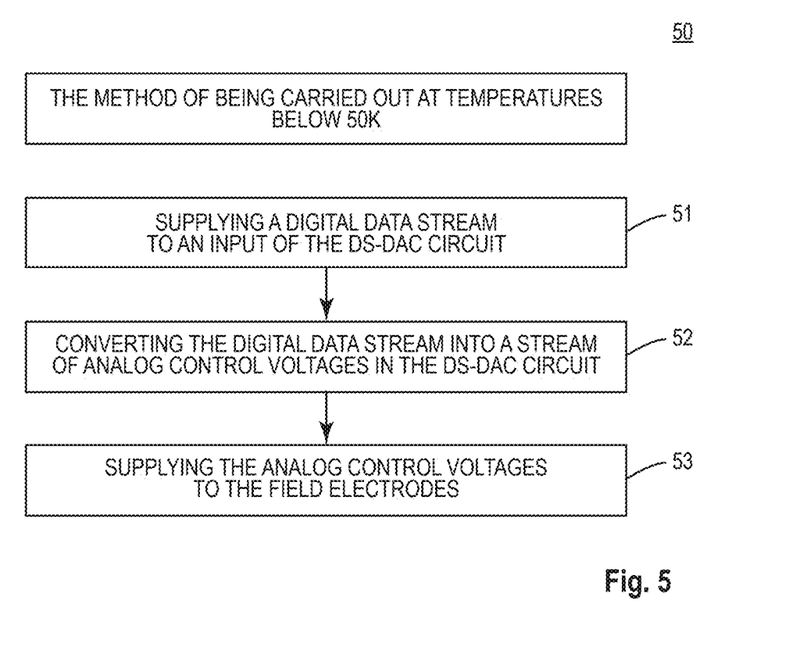
FIG. 5 shows a flow diagram of an example of a method for controlling trapped ions in a device.

FIG. 5 shows a flow diagram of an example of a method for controlling trapped ions in a device.

The method 50 of FIG. 5 shows a method of controlling trapped ions in a device, the device comprising a carrier, an ion trap disposed on the carrier, a plurality of field electrodes for controlling the ions in the ion trap, and a controller chip disposed on the carrier, the controller chip comprising at least one delta-sigma digital to analog converter (DS-DAC) module comprising a DS-DAC circuit, the method being carried out at temperatures below 20 K and comprising supplying a digital data stream to an input of the DS-DAC circuit (Block 51), converting the digital data stream into a stream of analog control voltages in the DS-DAC circuit (Block 52), and supplying the analog control voltages to the field electrodes (Block 53).

According to an example, the method 50 further comprises disposing the carrier with the ion trap and the controller chip in a cryostat.

According to an example, the method 50 further comprises low pass filtering the analog control voltages output by the DS-DAC circuit. According to a further example thereof, the method 50 further comprises low pass filtering the analog control voltages by means of a switched capacitor filter.

According to an example, the method 50 further comprises data-weighted averaging the signals output by the DS-DAC circuit.

According to an example, the device further comprising a single DS-DAC module, and the method further comprises multiplexing the signals output by the single DS-DAC module and supplying the signals to the plurality of field electrodes.

According to an example, the method 50 further comprises generating, cooling and trapping ions in the ion trap.

According to an example, the method 50 further comprises carrying out quantum operations between trapped ions and reading-out qubit states in the ion trap.

Further embodiments of the method 50 can be formed by adding aspects or features which were described above in connection with the device for controlling trapped ions.

Figure 6:
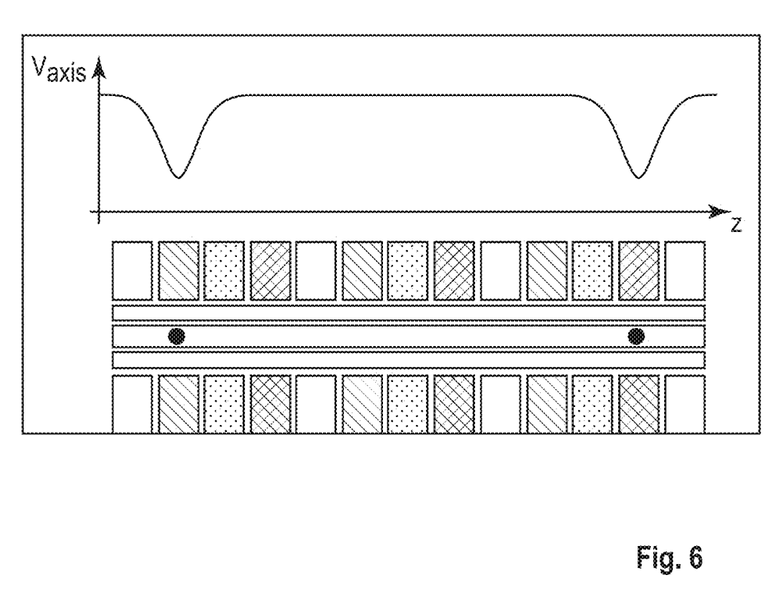
FIG. 6 shows a diagram for illustrating the transfer of ions within the ion trap.

FIG. 6 shows a diagram for illustrating the transfer of ions within the ion trap.

The lower part of FIG. 6 shows again a schematic top view of an ion trap comprising a central RF field electrode arrangement and DC field electrodes arranged in a symmetrical manner to both sides of the and the upper part is a diagram showing a trapping potential applied to the DC field electrodes. The lower part also indicates two ions (black dots) each trapped between opposing DC field electrodes due to the applied trapping potential.

In the following specific examples of the present disclosure are described.

Example 1 is a device for controlling trapped ions, the device comprising an ion trap, a plurality of field electrodes configured to control the ions in the ion trap, and a controller chip electrically connected to the field electrodes, the controller chip comprising at least one delta-sigma digital to analog converter (DS-DAC) module comprising a DS-DAC circuit configured to receive a digital data stream, to convert the digital data stream to analog control voltages, and to supply the analog control voltages to the field electrodes.

Example 2 is the device according to Example 1, wherein the DS-DAC module further comprises a first low pass filter connected to an output of the DS-DAC circuit.

Example 3 is the device according to Example 2, wherein the first low pass filter comprises a switched capacitor filter.

Example 4 is the device according to any one of the preceding Examples, comprising a plurality of DS-DAC modules, each one being configured to receive a digital data stream, to convert the digital data stream to analog control voltages, and to supply the control voltages to at least one of the field electrodes.

Example 5 is the device according to any one of the preceding Examples, further comprising a second low pass filter connected to an output of the DS-DAC module and at least one of the field electrodes.

Example 6 is the device according to any one of the preceding Examples, wherein the controller chip is connected to the field electrodes by means of bond wires.

Example 7 is the device according to any one of the preceding Examples, wherein the field electrodes comprise two rows of DC electrodes and an RF rail electrode arrangement.

Example 8 is a method of controlling trapped ions in a device, the device comprising an ion trap, a plurality of field electrodes configured to control the ions in the ion trap, and a controller chip electrically connected to the plurality of field electrodes, the controller chip comprising at least one digital to analog converter (DAC) module comprising a DAC circuit, the method being carried out at temperatures below 50 K, in particular below 20 K, and comprising supplying a digital data stream to an input of the DAC circuit, converting the digital data stream into analog control voltages in the DAC circuit, and supplying the analog control voltages to the field electrodes.

Example 9 is the method according to Example 8, wherein the digital to analog converter (DAC) is implemented as a delta-sigma digital to analog converter (DS-DAC).

Example 10 is the method according to Example 8 or 9, further comprising disposing the ion trap and the controller chip side-by-side in a cryostat.

Example 11 is the method according to any one of Examples 8 to 10, further comprising low pass filtering the analog control voltages output by the DAC circuit.

Example 12 is the method according to Example 11, further comprising low pass filtering the analog control voltages by means of a switched capacitor filter.

Example 13 is the method according to any one of Examples 8 to 12, further comprising:
multiplexing of control voltages by means of a switching matrix.

Example 14 is the method according to Example 13, wherein the multiplexing is implemented by incorporating switches in the ion trap.

Example 15 is the method according to any one of Examples 8 to 14, further comprising data-weighted averaging the signals output by the DS-DAC circuit.

Example 16 is the method according to any one of claims 8 to 15, further comprising generating, cooling and trapping ions in the ion trap.

Example 17 is the method according to any one of Examples 8 to 16, further comprising, carrying out quantum operations between trapped ions and reading-out qubit states in the ion trap.

Example 18 is a device for controlling trapped ions, the device comprising a carrier, an ion trap disposed on the carrier, a plurality of field electrodes configured to control the ions in the ion trap, and a controller chip disposed on the carrier and electrically connected to the field electrodes, the controller chip comprising at least one digital to analog converter (DAC) module comprising a DAC circuit configured to receive a digital data stream, to convert the digital data stream to analog control voltages, and to supply the analog control voltages to the field electrodes.

Example 19 is the device according to Example 18, wherein the digital to analog converter (DAC) is implemented as a delta-sigma digital to analog converter (DS-DAC).

Example 20 is the device according to Example 18 or 19, wherein the DAC module further comprises a first low pass filter connected to an output of the DS-DAC circuit.

Example 21 is the device according to Example 20, wherein the first low pass filter comprises a switched capacitor filter.

Example 22 is the device according to any one of Examples 18 to 21, comprising a plurality of DAC modules, each one being configured to receive a digital data stream, to convert the digital data stream to analog control voltages, and to supply the control voltages to at least one of the field electrodes.

Example 23 is the device according to any one of Examples 18 to 22, further comprising a second low pass filter connected to an output of the DAC module and at least one of the field electrodes.

Example 24 is the device according to any one of Examples 18 to 23, wherein the controller chip is connected to the field electrodes by means of bond wires.

Example 25 is the device according to any one of Examples 18 to 24, wherein the field electrodes comprise two rows of DC electrodes and an RF rail electrode arrangement.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A device for controlling trapped ions, the device comprising:
   an ion trap;
   a plurality of field electrodes configured to control ions in the ion trap; and
   a controller chip electrically connected to the field electrodes, the controller chip comprising at least one delta-sigma digital to analog converter (DS-DAC) module comprising a DS-DAC circuit configured to:
   receive a digital data stream;
   convert the digital data stream to analog control voltages; and
   supply the analog control voltages to the field electrodes.

2. The device of claim 1, wherein the DS-DAC module further comprises a low pass filter connected to an output of the DS-DAC circuit.

3. The device of claim 2, wherein the low pass filter comprises a switched capacitor filter.

4. The device of claim 1, further comprising:
   a plurality of DS-DAC modules, each one being configured to receive a digital data stream, convert the digital data stream to analog control voltages, and supply the control voltages to at least one of the field electrodes.

5. The device of claim 1, further comprising:
   a low pass filter connected to an output of the DS-DAC module and at least one of the field electrodes.

6. The device of claim 1, wherein the controller chip is connected to the field electrodes by bond wires.

7. The device of claim 1, wherein the field electrodes comprise two rows of DC electrodes and an RF rail electrode arrangement.

8. A method for controlling trapped ions, the method comprising:
   providing a device that includes an ion trap, a plurality of field electrodes configured to control ions in the ion trap, and a controller chip electrically connected to the plurality of field electrodes, the controller chip comprising at least one digital to analog converter (DAC) module comprising a DAC circuit;
   at temperatures below 50 K:
   supplying a digital data stream to an input of the DAC circuit;
   converting the digital data stream into analog control voltages in the DAC circuit; and
   supplying the analog control voltages to the field electrodes.

9. The method of claim 8, wherein the at least one DAC module is implemented as a delta-sigma digital to analog converter (DS-DAC).

10. The method of claim 8, further comprising:
    disposing the ion trap and the controller chip side-by-side in a cryostat.

11. The method of claim 8, further comprising:
    low pass filtering the analog control voltages output by the DAC circuit.

12. The method of claim 8, further comprising:
    low pass filtering the analog control voltages by a switched capacitor filter.

13. The method of claim 8, further comprising:
    multiplexing of control voltages by a switching matrix.

14. The method of claim 13, wherein the multiplexing is implemented by incorporating switches in the ion trap.

15. The device of claim 2, wherein the DS-DAC module further comprises a multiplexer connected to an output of the low pass filter.

16. The device of claim 4, further comprising:
    a shift register section configured to split up an incoming digital data stream into a plurality of digital data streams, and to provide a respective one of the plurality of digital data streams to a respective one of the plurality of DS-DAC modules as the digital data stream for conversion into control voltages.

17. The device of claim 1, wherein the ion trap and the controller chip are disposed on a same carrier.

18. The device of claim 1, wherein the DS-DAC module further comprises a plurality of low pass filters that are connected in series, and a multiplexer, wherein a first one of the plurality of low pass filters is connected to an output of the DS-DAC circuit, and wherein the multiplexer is connected to an output of a last one of the plurality of low pass filters.

19. The device of claim 1, wherein the controller chip is connected to the field electrodes by one or more metallization layers.

* * * * *